United States Patent [19]

Houston

[11] Patent Number: 5,565,799
[45] Date of Patent: Oct. 15, 1996

[54] ON CHIP ERROR DETECTION CIRCUIT

[75] Inventor: Theodore W. Houston, Richardson, Tex.

[73] Assignee: Texas Insturments Incorporated, Dallas, Tex.

[21] Appl. No.: 476,244

[22] Filed: Jun. 7, 1995

Related U.S. Application Data

[62] Division of Ser. No. 285,457, Aug. 3, 1994, which is a division of Ser. No. 901,743, Jun. 22, 1992, Pat. No. 5,361,033, which is a division of Ser. No. 737,584, Jul. 25, 1991, Pat. No. 5,157,335, which is a continuation of Ser. No. 395,853, Aug. 18, 1989, abandoned.

[51] Int. Cl.$^6$ ............................. G01R 19/00; H03L 7/00
[52] U.S. Cl. ................... 327/52; 327/81; 327/143
[58] Field of Search .................... 327/50–57, 63, 327/64, 65, 77, 88, 89, 142, 143, 560–563, 80, 81

[56] References Cited

U.S. PATENT DOCUMENTS

| | | | |
|---|---|---|---|
| 4,142,118 | 2/1979 | Guritz | 327/143 |
| 4,309,627 | 1/1982 | Tabata | 327/143 |
| 4,789,825 | 12/1988 | Carelli et al. | 324/158 T |
| 5,144,159 | 9/1992 | Frisch et al. | 327/198 |
| 5,329,171 | 7/1994 | Shimizu et al. | 327/78 |
| 5,343,086 | 8/1994 | Fung et al. | 327/77 |
| 5,469,081 | 11/1995 | Horita et al. | 327/77 |

*Primary Examiner*—Toan Tran
*Attorney, Agent, or Firm*—Jacqueline J. Garner; Wade James Brady, III; Richard L. Donaldson

[57] ABSTRACT

A memory cell system is disclosed with properties of asymmetrical operation such that the occurrence of memory error due to certain environmental disturbances is detectable. The asymmetry of operation can be adjusted to set the level at which the disturbance is detected. Detection of memory error in the system can be used to shut off access to an associated memory array in order to prevent error in the array.

1 Claim, 8 Drawing Sheets

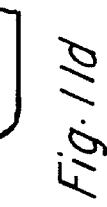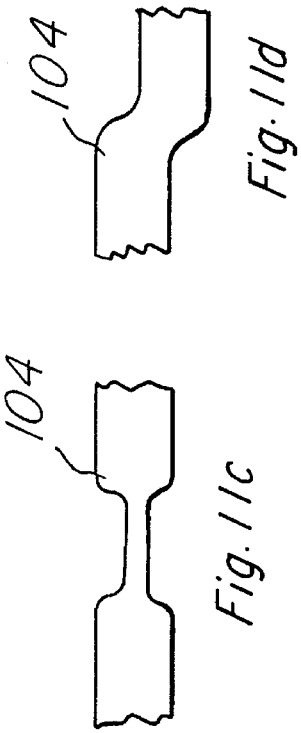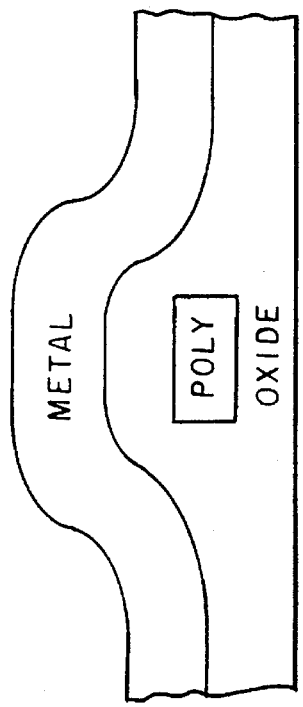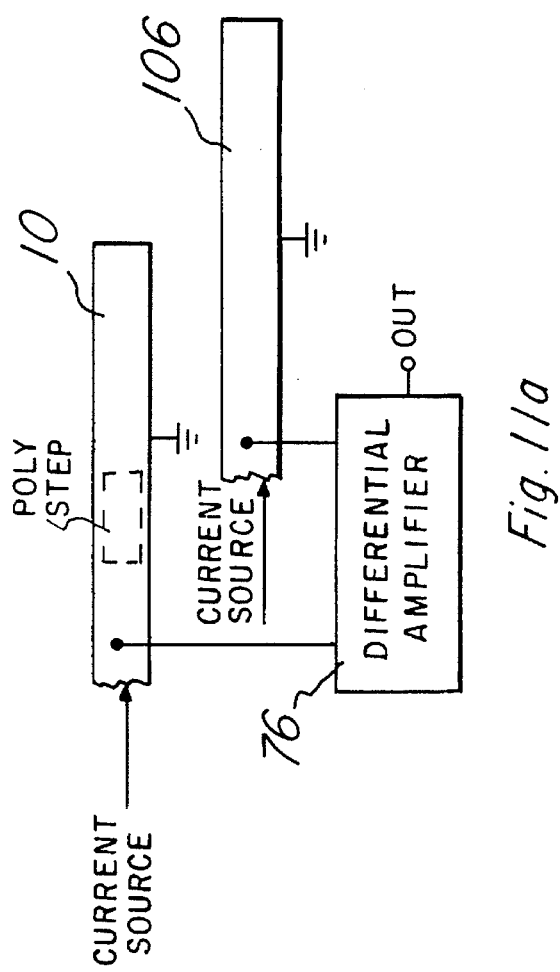

ON CHIP ERROR DETECTION CIRCUIT

This is a Division, of application Ser. No. 08/285,457 filed on Aug. 3, 1994; which is a Divisional of Ser. No. 07/901,743 filed on Jun. 22, 1992, U.S. Pat. No. 5,361,033; which is a Divisional of Ser. No. 07/737,584 filed Jul. 25, 1991, U.S. Pat. No. 5,157,335; which is a Continuation of Ser. No. 07/395,853 filed Aug. 18, 1989 now abandoned.

FIELD OF THE INVENTION

This invention is in the field of integrated circuits and generally relates to memory devices and detection devices.

BACKGROUND OF THE INVENTION

Detection of conditions under which some information is apt to be lost can be of primary importance in the development of memory system such as those including static random access memories (SRAMs) or dynamic random access memories (DRAMs). Failure which causes a memory to store the wrong memory state may result, for instance, from the loss of memory power or from memory exposure over a period of time to accumulated radiation. Additionally, memory error may result from memory exposure to a pulse of gamma radiation (gamma dot).

It is desirable to have a memory system capable of detecting conditions that lead to memory error such that recovery procedures can be instituted. Furthermore, it is desirable to have a memory system capable of detecting an impending error causing situation such that memory error can be prevented.

Although detection schemes exist for various conditions, e.g. gamma dot detection, an on chip detector that can be closely matched to the failure levels of the actual circuit, and that could initiate prompt on chip corrective/preventive action could be beneficial.

OBJECTS OF THE INVENTION

It is an object of the invention to provide a new and improved scheme for detection of conditions that may cause circuit failure.

It is another object of the invention to provide a new and improved scheme for the prevention of memory error.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are accomplished through the use of a memory cell which can be set to store an unfavored voltage state. Upon the occurrence of a predetermined level of a disturbance such as gamma dot, accumulated radiation, or the loss of memory cell power, the memory cell changes states and holds a favored voltage state.

In a first preferred embodiment of the invention, the favored state results from circuitry comprising a predetermined number of dummy memory cells which are hardwired so as to store the favored state. In connection with the disturbance, pass transistors allow the transfer of the favored state to the memory cell.

In a second preferred embodiment of the invention, a p-channel transistor with its gate tied to its source provides the origin of the favored voltage state.

In a third preferred embodiment of the invention, a n-channel transistor with its gate tied to its source provides the origin of the unfavored voltage state.

In fourth and fifth preferred embodiments of the invention, a series of gate to source tied n-channel or p-channel transistors respectively are connected to a memory cell. Each transistor is separable from the next in the series by a fuse. Thus, fuse trimmable detection devices are provided that are capable selecting the level at which disturbance detection occurs.

In a sixth preferred embodiment of the invention, capacitors have been substituted in place of dummy cells. This embodiment of the invention is capable of indicating a loss of power situation for the detection circuit and its associated memory array.

Several other preferred embodiments of the invention provide harmful temperature change detection, and/or threshold voltage changes through the use of a differential amplifier connected to paths of varying resistance wherein the resistance changes in response to temperature change and/or voltage threshold changes.

Still further preferred embodiments of the invention provide voltage spike detection through the use of capacitor charging methods in connection with a sense amp and latch.

BRIEF DESCRIPTION OF THE DRAWINGS

FIG. 11a is a schematic drawing of the tenth preferred embodiment of the invention.

FIG. 11b is a cross-sectional diagram of the tenth preferred embodiment of the invention.

FIG. 11c is a cross-sectional diagram of an alternative metal strip according to the tenth preferred embodiment of the invention.

FIG. 11d is a cross-sectional diagram of a second alternative metal strip according to the tenth preferred embodiment of the invention.

DETAILED DESCRIPTION OF THE INVENTION

The invention is used in connection with an associated memory array in order to detect the occurrence of a condition that is likely to cause error in the array or the high likelihood of impending error in the array.

The invention uses a detection memory cell as a transient dose detector by introducing some asymmetry so that the cell has a favored state. On set (or re-set), a WRITE into the cell places the detection memory cell in an unfavored state. Under sufficient radiation effects or power down situations, the detection memory cell switches to the favored state.

The asymmetry introduced to the cell must be such that the cell will change to the favored state at a transient dose level or accumulated radiation level that is approaching the level at which cells in the associated memory array may be upset or at which associated circuitry will fail. One way to do this is to introduce an asymmetry on the bit lines of the detector cell that matches the worst case asymmetry in the memory array, i.e. n−1 memory cells with a voltage state opposite to the set state of the detection memory cell, where n is the number of rows in the memory array. In addition to the cell loading, the bit lines should be loaded the same as in the actual memory array, for example, being held in precharge when the chip is not enabled.

Figure 1:
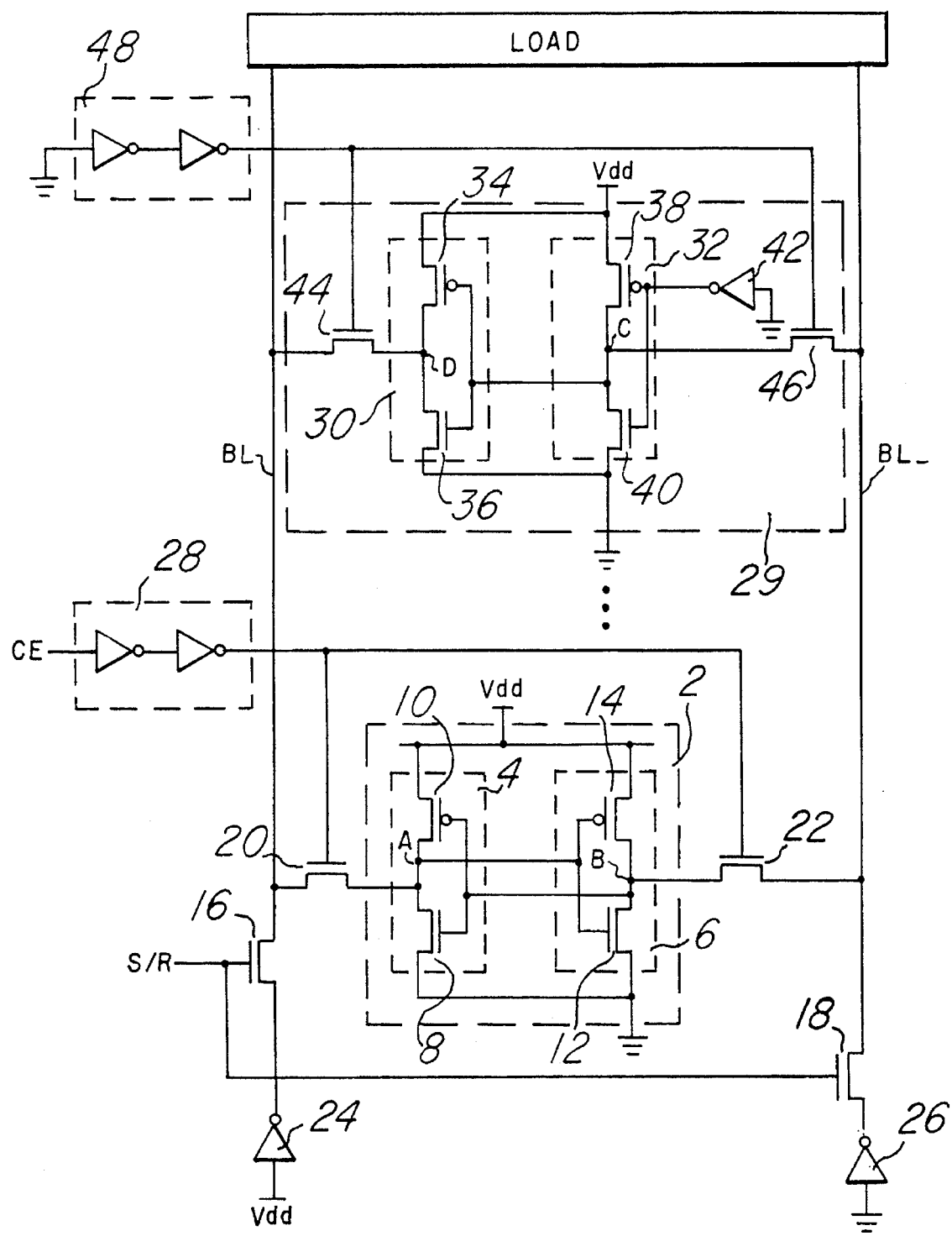
FIG. 1 is a schematic drawing which illustrates a first preferred embodiment of the invention.

FIG. 1 illustrates a first preferred embodiment of the invention. Dummy or detection column generally referenced by numeral 1 need not be part of the memory array. Transient dose, accumulated radiation or power off situations can be sensed at any time independent of the array addressing/sensing. Detection memory cell 2 comprises inverters 4 and 6 which are cross-coupled such that the output of one is connected to the input of the other. Inverter 4 comprises n-channel transistor 8 and p-channel transistor 10 while inverter 5 comprises n-channel transistor 12 and p-channel transistor 14. Memory cell 2 is connected to voltage Vdd and circuit ground. Note, however, a voltage higher than circuit ground which is lower than Vdd could be substituted for the circuit ground of cell 2.

Node A forms the output of inverter 4 and node B forms the output of inverter 5. A high voltage relative to the voltage at node A is placed on node B. This shall be referred to as the unfavored voltage state for memory cell 2. A set/reset signal S/R can gate n-channel transistors 16 and 18 so that signals can be transferred to the outputs at nodes A and B of inverters 4 and 6 respectively. Pass transistors 20 and 22, gated by a chip enable signal CE or other control signal through two series connected inverters 28, allow signals traveling through transistors 16 and 18 to reach nodes A and B respectively. The origin of the signal to node A is from voltage Vdd inverted through inverter 24. The origin of the signal to node B is from circuit ground inverter through inverter 26.

A state which shall be referred to as the favored state is stored in dummy memory cell 29 in order to introduce some asymmetry to cell 2. More than one dummy memory cell may be used. For instance, if the associated memory array contains n columns (n being an integer), n−1 dummy cells may be used. Alternatively, a smaller number of dummy cells may be used if the dummy cells are oversized in comparison with memory cell 2. Dummy memory cell 29 comprises two inverters 30 and 32. Inverter 30 comprises p-channel transistor 34 connected to n-channel transistor 36. Inverter 32 comprises p-channel transistor 38 connected to n-channel transistor 40. The input of inverter 30 is tied to the output of inverter 32, node C. The output of inverter 32 is hard-wired to a low voltage level relative to the high voltage level received at its input through inverter 42 which inverts a circuit ground signal. Consequently, the output of inverter 30, node D, is placed at a high voltage relative to the output of inverter 32. The high voltage at the output of inverter 30 and the low voltage at the output of inverter 32 represents the unfavored stored state. N-channel pass transistors 44 and 46 allow passage of the favored state onto two bit lines BL and BL_. Transistors 44 and 46 are normally gated off by circuit ground (shown in this example as connected to two series connected inverters 48). However, upon the occurrence of the sufficient level of gamma dot or alternatively, radiation accumulated over a longer period of time (than that of gamma dot), transistors 44 and 46 become leaky (and conduct photo current in the gamma dot situation), thereby allowing the transfer of information from cell 29 to the bit lines. The favored state is thus transferred to memory cell 2 through transistors 20 and 22. Note that bit lines BL and BL_ are initially precharged to a predetermined level by circuitry included in the load (which may represent the associated memory array) which is connected to bit lines BL and BL_ as shown. In order to pull voltage down on bit lines properly in the accumulated radiation case, it is important that the pull-down current through the combination of transistors 46 be less than that of the pull-down current through transistor 20. Otherwise, a sense amplifier (also referred to as sense amp), not shown, connected to bit lines BL and/or BL_ detects the favored state properly indicating a failure condition even if the detection cell has not changed state. Circuitry can be added to have the sense amplifier send a signal through the usual memory array output. For the case of gamma dot, circuitry can be connected to the memory array to shut off access to the memory cells once the error situation on cell 2 has been detected. The shut off can prevent memory loss, since the memory is least vulnerable in standby, provided that detection time and shut off time are shorter than the time needed to latch a gamma dot produced memory state. Otherwise, information in the associated memory array can be ignored and recovery procedures instituted.

Different ways to prevent array access are possible depending on the memory architecture. For a block architecture, for example, a good way would be to have all blocks deselected by the detection signal. This signal would result in quickly shutting off word lines and would initiate precharge/equalization of all bit lines, thus putting the memory array in its most stable state.

A loss of power can also be detected by memory cell 2. A high set/reset signal S/R only turns on to establish the unfavored state on memory cell 2. Once the state is established, signal S/R is turned off. A power lost can disturb the voltage originally established on memory cell 2. Upon restoration of power, the favored state will appear at nodes A and B. The sense amp will detect this change and appropriate action such as ignoring information in the associated memory array can be taken.

Another way to introduce asymmetry to the detection memory cell is by adding an "off-transistor", i.e. a transistor with its gate tied to its source. This will add minimal asymmetry under normal conditions and adds asymmetry under transient dose. Varying the size of the "off device" will vary the transient dose level at which the cell will flip from the unfavored state to the favored state.

Figure 2:
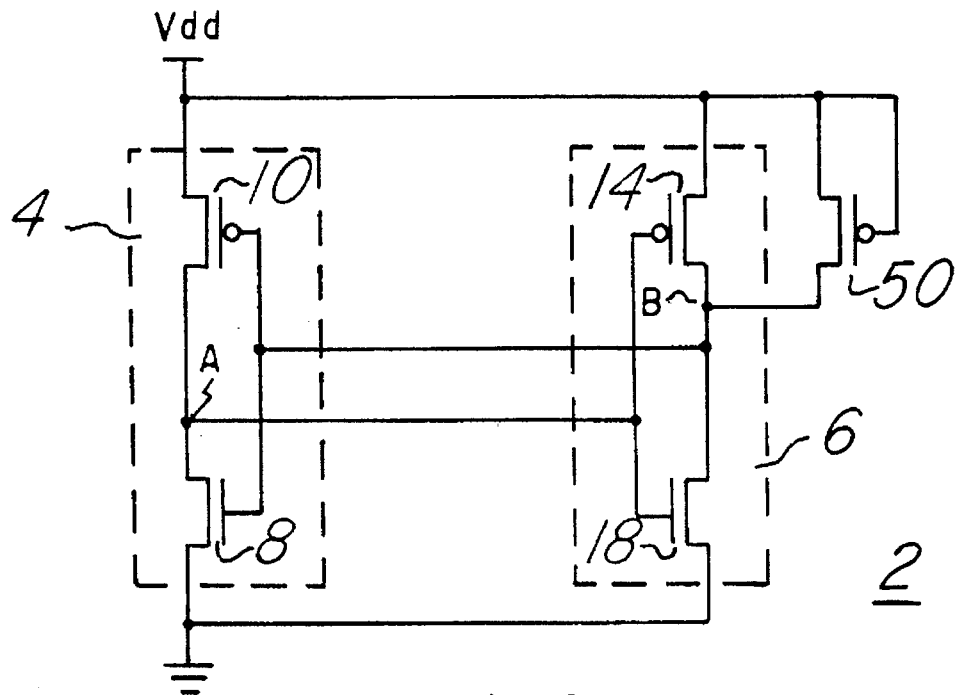
FIG. 2 is a schematic drawing which illustrates a second preferred embodiment of the invention.

A second preferred embodiment of the invention is illustrated in the schematic drawing of FIG. 2. This embodiment is similar to that shown in FIG. 1 except that p-channel transistor 50, with its gate tied to its source and its drain connected to node B, provides the unfavored state. For the example of the invention shown in FIG. 2, the unfavored state originally established is one with node A higher in voltage than node B. Upon the occurrence of transient dose radiation (gamma dot) or accumulated radiation, transistor 50 tends to make node B higher in voltage than node A. Thus a detectable favored state on cell 2 is established. The power loss favored state is similarly detected as in the circuit of FIG. 1.

Figure 3:
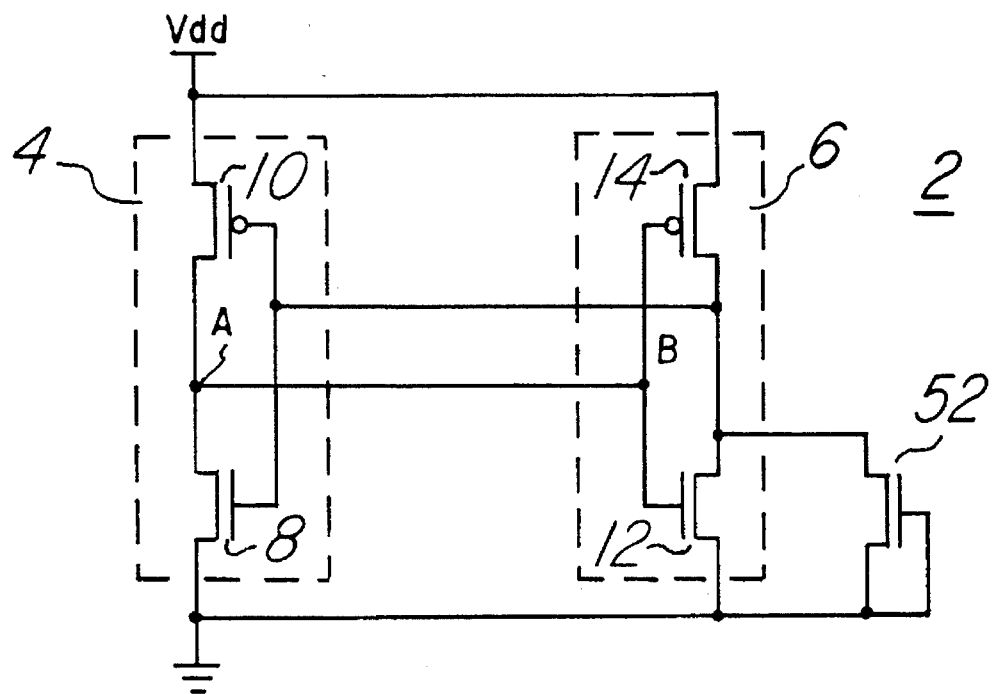
FIG. 3 is a schematic drawing which illustrates a third preferred embodiments of the invention.

FIG. 3 illustrates a schematic drawing of a third preferred embodiment of the invention. This embodiment is similar to that shown in FIG. 1 except that n-channel transistor 52, with its gate tied to its source and its drain connected to node B provides the favored state. For the example of the invention shown in FIG. 3, the unfavored state originally established is one with node B higher in voltage than node A. Upon the occurrence of transistor dose radiation or accumulated radiation, transistor 52 tends to make node B lower in voltage than node A. Thus a detectable favored state on cell 2 is established. The power loss favored state is similarly detected as in the circuit of FIG. 1.

Figure 4:
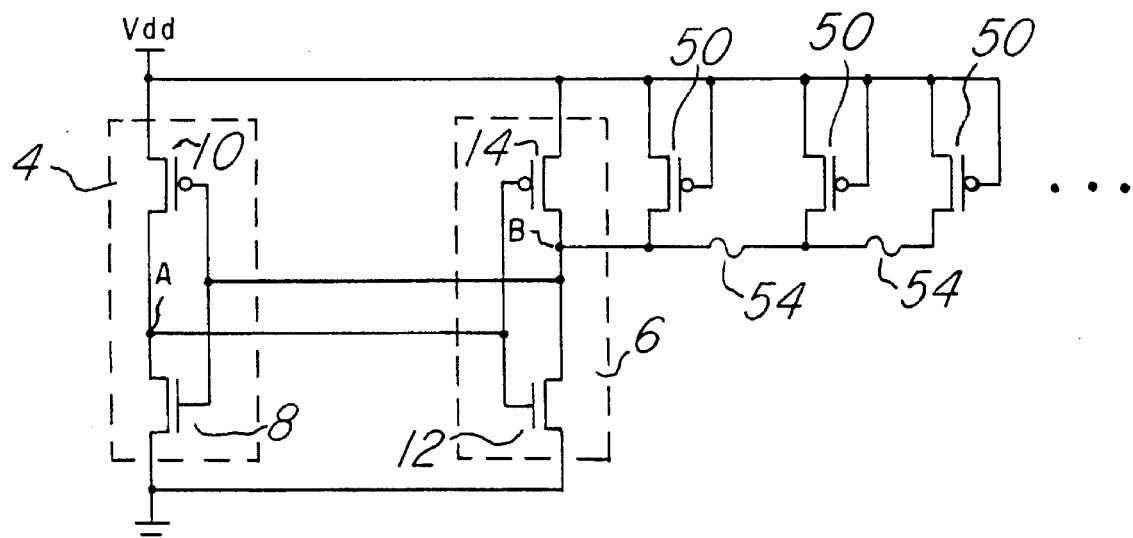
FIG. 4 is a schematic drawing which illustrates a fourth preferred embodiment of the invention.
Figure 5:
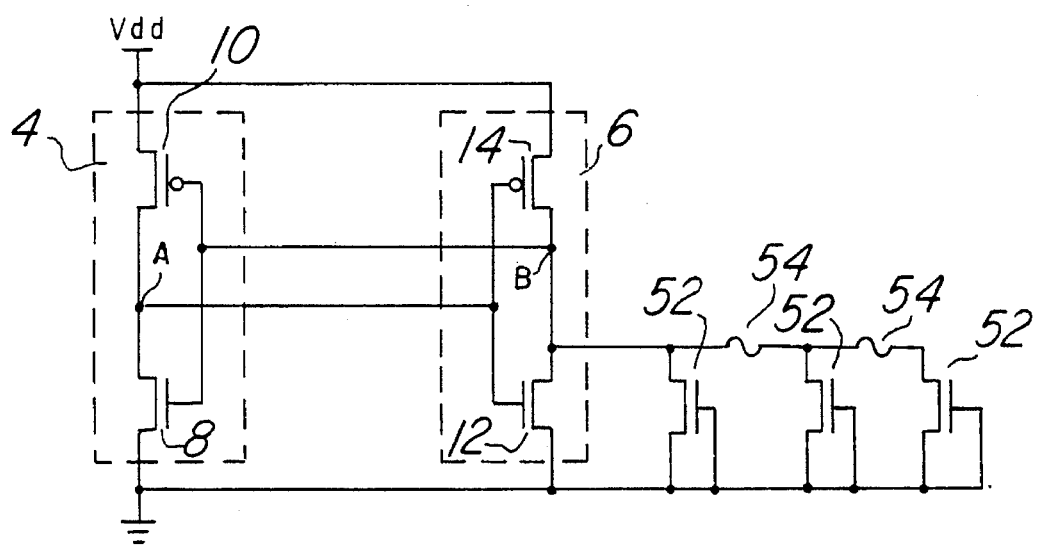
FIG. 5 is a schematic drawing which illustrates a fifth preferred embodiment of the invention.

The level of gamma dot or accumulated radiation for tripping the detection memory cell can be set by the amount of asymmetry in the detection memory cell. FIGS. 4 and 5 illustrate fourth and fifth preferred embodiments of the invention respectively. In FIG. 4, fuses 54 separate each transistor 50 of a series of transistors 50 connected in parallel. Similarly in FIG. 5 fuses 54 separate each transistor 52 connected in parallel. The circuits in FIGS. 4 and 5 operate similarly to those circuits shown in FIGS. 2 and 3 respectively, except that sensitivity to radiation is increased with an increasing number of transistors 50 for FIG. 4 and an increasing number of transistors 52 for FIG. 5. Fuses 54 can be blown (trimmed) so as to disconnect the desired number of parallel transistors in order to adjust radiation detection sensitivity to suit a particular application. Laser trimmable fuses, for instance, can be used.

Figure 6:
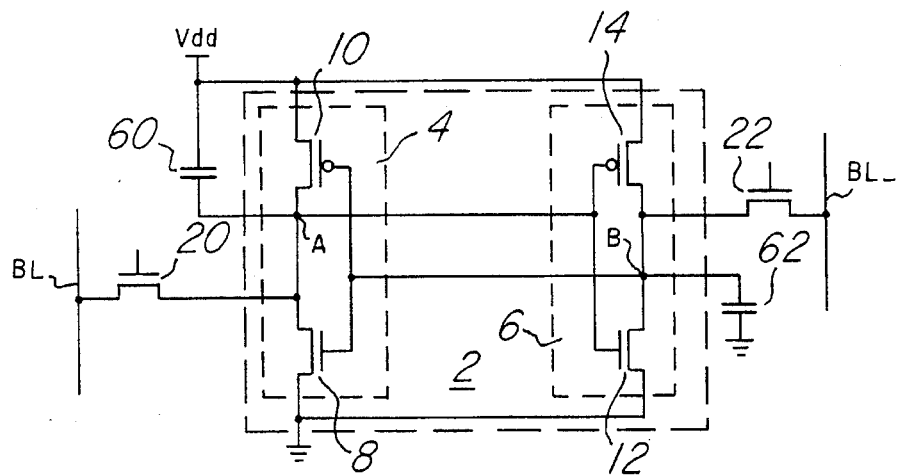
FIG. 6 is a schematic drawing which illustrates a sixth preferred embodiment of the invention.

FIG. 6 represents a schematic drawing of a sixth preferred embodiment of the invention. This embodiment is similar to the embodiment shown in FIG. 1 except that dummy cells are no longer needed and that capacitors 60 and 62 have been added. Capacitor 60 is connected to and between voltage Vdd and node A while capacitor 62 is connected to and between node B and circuit ground. An unfavored state is initially written to detection memory cell 2 by circuitry (not shown) similar to that illustrated in FIG. 1. In a power down situation, voltage drains from all nodes in cell 2. Once power returns, capacitors 60 and 62 force the voltage to the opposite, favored, state in cell 2. Thus, a sense amplifier (not shown) connected to either or both bit lines can detect the favored state which in this case is indicative of an instance of power loss. Note also that capacitors 60 and 62 can be added in like manner to the circuit shown in FIG. 1.

Figure 7:
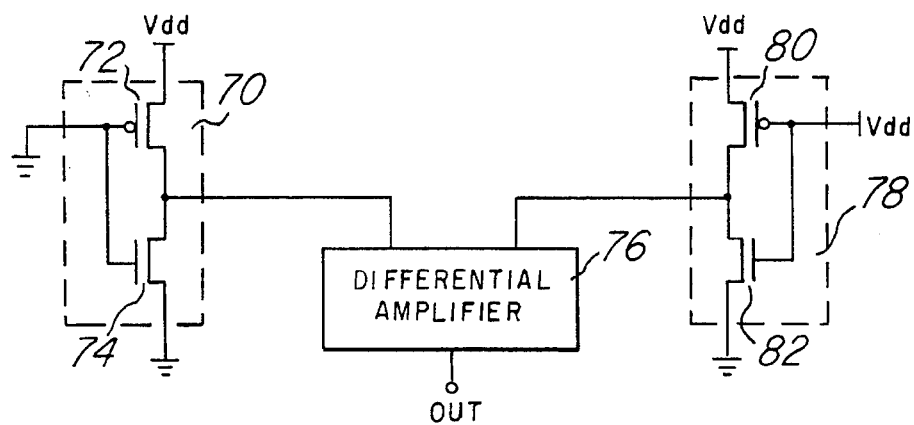
FIG. 7 is a schematic drawing of the seventh preferred embodiment of the invention.

FIG. 7 illustrates a schematic drawing of a seventh preferred embodiment of the invention. Inverter 70 comprising p-channel transistor 72 connected to n-channel transistor 74, has its output connected to one input of differential amplifier 76. Another inverter 78 comprising p-channel transistor 80 connected to n-channel transistor 82 has its output connected to a second input of differential amplifier 76. The input of inverter 70 is connected to circuit ground while the input of inverter 78 is connected to circuit supply voltage Vdd. Thus, transistors 74 and 80 are turned "off" and transistors 72 and 82 are "on." The output of differential amplifier 76 is taken from node OUT. The circuit of FIG. 7 can detect voltage threshold shifts and or leakage current increases due for instance perhaps to temperature changes.

Additionally, the circuit can be used to detect a predetermined level of total dose radiation with respect, for example, to nuclear reactor control circuitry. Transistor 74's channel region is wide in comparison with transistor 72's relatively narrow channel region. Likewise, transistor 80's channel region is relatively wide in comparison with transistor 82's relatively narrow channel region. Narrow transistors 72 and 82 can have a relatively long channel region in order to reduce current flow therein. Differential amplifier 76's output at node OUT changes when the leakage current of the wide "off" transistor of each inverter becomes greater than the current through the narrow "on" transistor of its respective inverter. The output at node OUT would send a signal to an associated device, i.e. memory device, of which the transistors in FIG. 7 are representative of. Steps can then be taken to protect the associated device from upset due to the threshold voltage change, total dose level or temperature change. The widths and lengths of the channel regions of the transistors of FIG. 7 can be adjusted to produce the trip point at the level of leakage to be detected.

Figure 8:
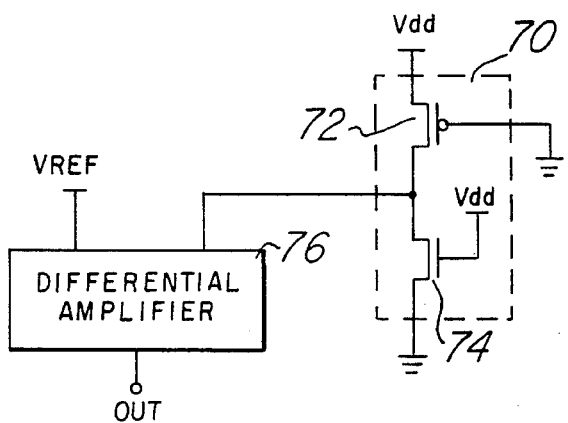
FIG. 8 is a schematic drawing of the eighth preferred embodiment of the invention.

FIG. 8 illustrates an eighth preferred embodiment of the invention. This figure shows a similar device as in FIG. 7 except that a voltage reference signal Vref has been substituted for one off the inverters as an input to differential amplifier 76. Vref may result from the output of a diode or from a bipolar band-gap circuit for instance. Although inverter 78 of FIG. 7 is replaced by Vref in FIG. 8, it is also possible to keep inverter 78 as an input to differential amplifier 76 and replace inverter 70 with a Vref input to differential amplifier 76. Operation of the eighth embodiment of the invention is similar to that of the seventh embodiment of the invention. Simply stated, the wide "off" transistor will change the output to a different level in connection with greater leakage current in the "off" transistor than the current in the "on" transistor.

Figure 9:
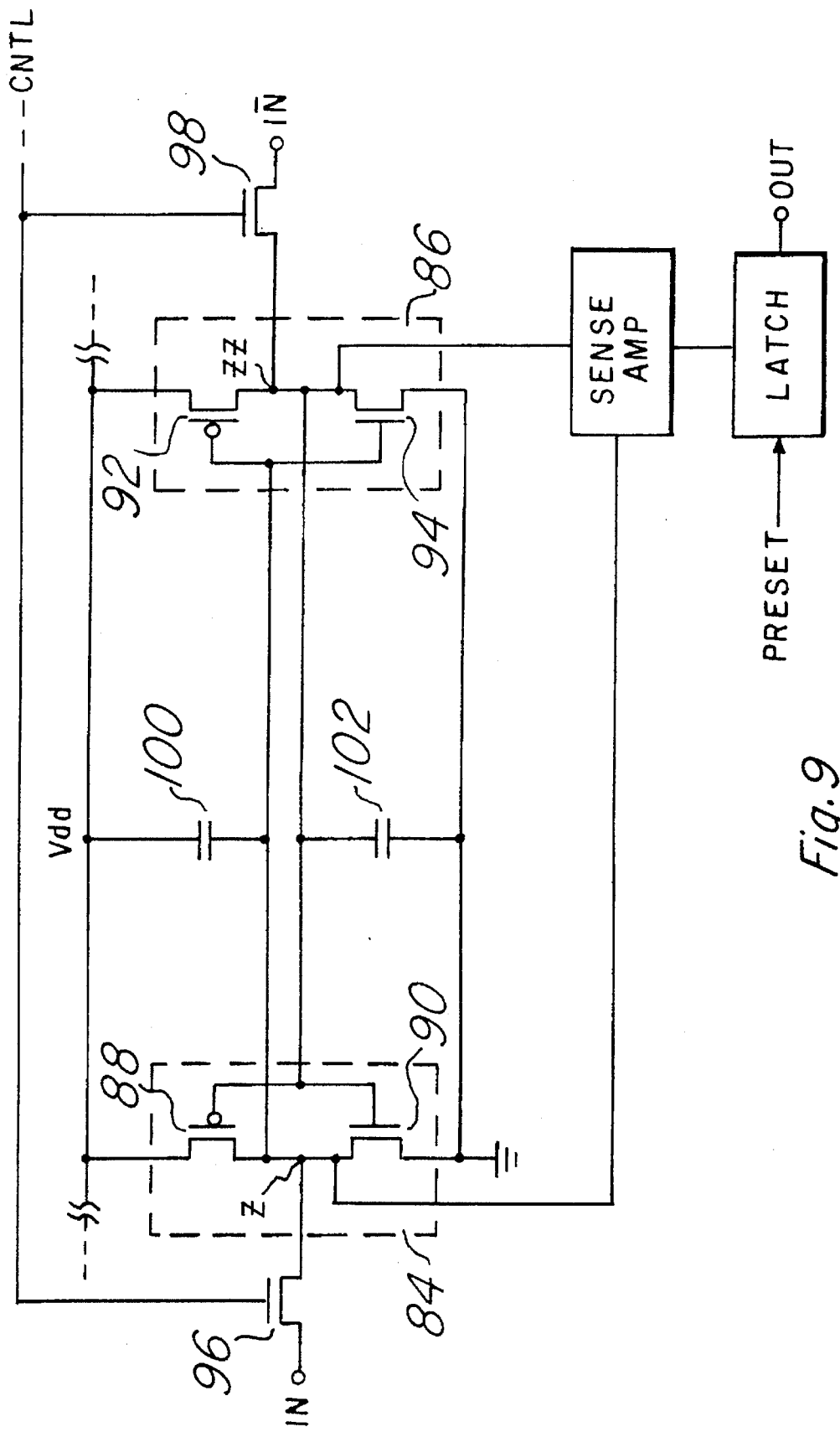
FIG. 9 is a schematic drawing of the ninth preferred embodiment of the invention.

FIG. 9 illustrates a schematic drawing of a ninth preferred embodiment of the invention. This embodiment comprises two cross-coupled inverters 84 and 86. Inverter 84 includes p-channel transistor 86 connected to n-channel transistor 90. Inverter 86 comprises p-channel transistor 92 connected to n-channel transistor 94. Both inverters are connected between supply voltage Vdd and circuit ground (although a voltage other than circuit ground can be substituted for circuit ground). Two pass transistors 96 and 98 gated by control signal CNTL are connected to inverters 84 and 86 respectively. Capacitor 100 is connected between Vdd and the output of an inverter 84, node Z, (and the input of inverter 86). Capacitor 102 is connected between the output of inverter 86, node ZZ, (and the input of inverter 84) and circuit ground. A sense amplifier (differential amplifier) denoted by the abbreviated expression sense amp receives the outputs from the inverters. A latch receives the sense amp signal and transmits a signal at node OUT. A PRESET signal can also be received by the latch. Node IN is connected to a source/drain of transistor 96. Node IN_ is connected to a source/drain of transistor 98.

In operation, a voltage spike (high) on supply voltage Vdd tends to drive node Z high. Therefore, node Z is set low by a relatively low voltage at node IN relative to the relatively high signal at node IN_. Under a high power spike condition, capacitor 100 will drive node Z high and node ZZ low, thus flipping the states of the cross-coupled inverters. The sense amp amplifies the flipped states and the latch receives a signal from the sense amp and thereby latches this information. In order to detect a low going spike, node ZZ is set high by relatively high voltage at node IN relative to the relatively low signal at node IN_. Latching of the power spike occurs in a similar manner, as discussed above. Note access to nodes Z and ZZ through pass transistors 96 and 98 is determined by control signal CNTL. Note also that the latch can be reset or preset by the PRESET signal input shown. Once a power spike condition has been latched, a signal from the latch is transmitted to an associated circuit. This associated circuit i.e. memory or etc., can be protected from the power spike in connection with the receipt of the transmitted signal from the latch.

Figure 10A:
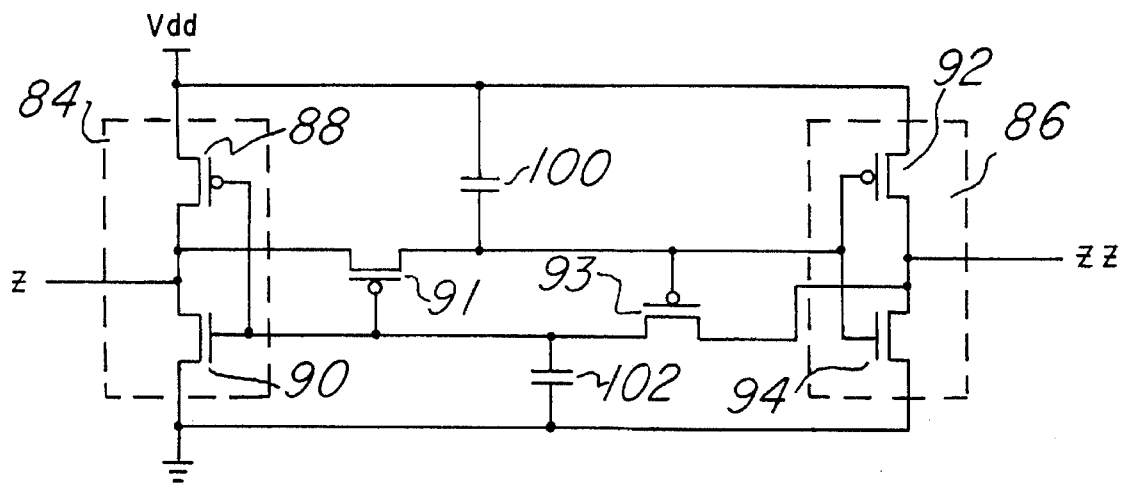
FIG. 10a is a schematic drawing of an alternative ninth preferred embodiment of the invention.

FIG. 10a illustrates an alternative embodiment of the ninth preferred embodiment of the invention. This embodiment is the same as that shown in FIG. 9 except that p-channel transistors 91 and 93 have been added to the cross-coupling thereby isolating the inputs of the inverters from the source/drains of the pass transistors. This addition makes the cell easier to flip by coupling through the capacitors, thus providing a more sensitive cell. The p-channel transistors may be leaky to ensure proper operation.

Figure 10B:
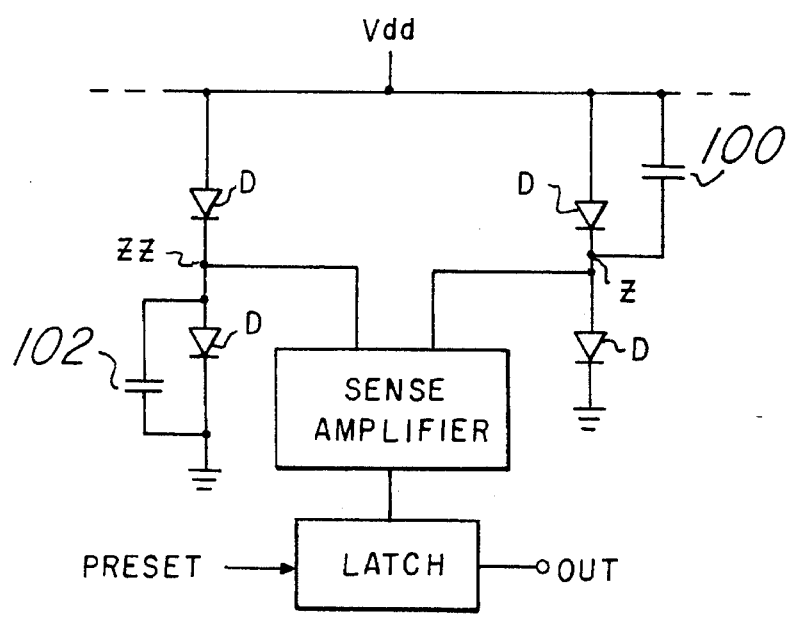
FIG. 10b is a schematic drawing of a second alternative ninth preferred embodiment of the invention.

FIG. 10b illustrates another alternative embodiment of the ninth preferred embodiment of the invention. This embodiment is similar to that shown in FIG. 9 except that diodes D have been substituted for selected transistors in FIG. 9. The diodes serve as voltage dividers. However, voltage dividers other than diodes can be used. Operation of this circuit is similar to the circuit of FIG. 9. The widths of the diodes are adjust to have initial differential voltages opposite that caused by the voltage spike. For instance, start with a higher voltage on node Z than node ZZ to detect a high going spike. Likewise, start with a lower voltage on node Z than node ZZ to detect a low going spike.

FIG. 11a illustrates a schematic drawing of the tenth embodiment of the invention. Metal strips 104 and 106 receive current from a current source and are connected at a first position to differential amplifier 76. Strips 104 and 106 are connected at a second position to circuit ground. A polycrystalline step (poly step) is within strip 104. With reference to FIG. 11b which illustrates a cross-sectional view of the polycrystalline step, denoted by the word "poly", it is seen that the metal strip forms a bump over the poly and separated therefrom by an insulator such as the oxide shown. The purpose of this circuit is to flag potential impending occurrences of metal migration in an associated circuit. In operation, the resistances of strips 104 and 106 are in effect "measured" by differential amplifier 76. Metal migration in strip 104 will increase its resistance such that its input voltage to differential amplifier 76 will change. Differential amplifier 76 will transmit a signal from node OUT in response to this changed input voltage. This signal can be sent to an associated circuit and appropriate action can be taken in response to the impending metal migration situation. Alternatively, instead of creating a bump in the metal strip, a neck or bend could be formed in metal strip 104 as shown in FIGS. 11c and 11d, respectively.

Figure 12:
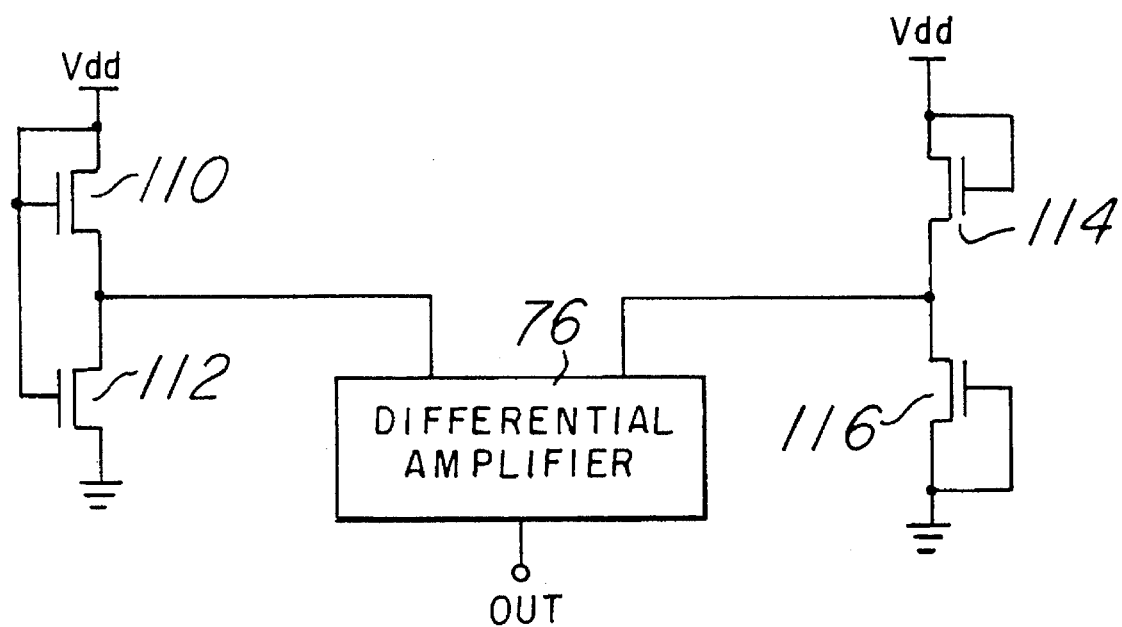
FIG. 12 is a schematic drawing of the eleventh preferred embodiment of the invention.

FIG. 12 illustrates a schematic drawing of an eleventh preferred embodiment of the invention comprising drain-to-gate connected n-channel transistors 110 and 114 connected as shown to differential amplifier 76, n-channel transistor 112 and p-channel transistor 116. This embodiment of the invention is particularly useful in device failure detection based on threshold voltage, Vt, shifts due to temperature changes. In operation, a Vt shift will produce a different output level from the output of differential amplifier 76. This level is used as before in disabling or notifying appropriate circuitry to act in response to the threshold voltage shift. Such a device has application, for instance, in personal computer systems.

It is possible for the on-chip detector to have special I/O for access to the detector cell. For instance, in addressing (accessing) the on-chip detector on a memory chip one of the address locations can be reserved for the detector. The standard I/O for input/output, read/write can be used to access the detector with a standard pin out. This can be hard wired, i.e., the reserved address (e.g. 0) always accesses the detector. For "non-stressed" application, the detector cell could be used as a normal memory cell. Another possibility for the detector cell is to have the detector cell access enabled by fuses in a redundant cell configuration. In this manner the same memory die can be used for application either with or without the on-chip detector. This latter approach would blend well with detector cells that uses fuses to set the level of sensitivity.

The above described on-chip detectors have application where integrated circuits, ICs, are replaced as part of maintenance. The detector is set to match the response of the IC but flags the undesired impending condition (e.g., excessive leakage or Vt shift) at some level prior to circuit failure. The flag can be checked and the IC and perhaps its associated part in a device can be replaced prior to device failure. The advantage of the on chip detector for this type of application is the ability to have the detector closely track the circuit it is monitoring. Possible applications include automotive ICs and ICs for control of nuclear reactors.

The foregoing described invention may be constructed according to many methods well known in the art of semiconductor fabrication.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For example, a detection cell can be set up with sensitivity to threshold voltage shifts due to temperature fluctuations (either high or low). An embodiment is also contemplated wherein a differential amplifier detects the correlation of when the leakage current from unselected memory cells in the array is greater than the current from a selected memory cell in the array, as might happen in an instance of accumulated gamma radiation.

Additionally, note that p-channel transistors illustrated in the foregoing drawings can be substituted with n-channel transistors and vice versa. These transistors are for instance MOS transistors. Other types of inverters besides those shown in the foregoing drawings are also contemplated. Load transistors (shown as the p-channel transistors) in the inverters can for instance, be substituted with a resistor. Also, bipolar transistors can be substituted for the field effect transistors shown. It is contemplated that all such changes and additional embodiments are within the spirit and true scope of the invention as claimed below.

I claim:

1. A detection circuit that comprises two inverters with each inverter connected to an input of a differential amplifier; and a bistable circuit connected to an output of the differential amplifier; wherein a p-channel transistor is connected to an n-channel transistor within each one of said inverters, with each one of said inverters including one of said transistors operable so as to be normally turned on while said bi-stable circuit is storing a first state such that the channel of said normally turned on transistor is smaller in comparison with the channel of the remaining inverter transistor, said remaining inverter transistor being normally turned off yet allowing a greater leakage current than the current in the normally turned on transistor when said bi-stable circuit is to store a second state.

* * * * *